United States Patent [19]
Pasic

[11] Patent Number: 5,933,521
[45] Date of Patent: Aug. 3, 1999

[54] WAFER READER INCLUDING A MIRROR ASSEMBLY FOR READING WAFER SCRIBES WITHOUT DISPLACING WAFERS

[75] Inventor: Robert A. Pasic, Vancouver, Wash.

[73] Assignee: Pasic Engineering, Inc., Vancouver, Wash.

[21] Appl. No.: 08/880,486

[22] Filed: Jun. 23, 1997

[51] Int. Cl.⁶ .............................. G02B 27/14; G06K 9/00
[52] U.S. Cl. ........................................... 382/145; 359/855
[58] Field of Search .................................... 382/145, 151; 348/87, 126; 356/71, 372–387, 445; 364/468.22, 468.23, 468.28; 438/16; 250/559.44; 206/710–712, 832; 211/41.18; 359/438, 515, 439, 855, 528, 546, 856, 857, 861, 382, 388

[56] References Cited

U.S. PATENT DOCUMENTS

| | | | |
|---|---|---|---|
| 4,790,027 | 12/1988 | Scherl | 382/54 |
| 4,794,647 | 12/1988 | Forgues et al. | 382/8 |
| 4,880,309 | 11/1989 | Wanta | 356/401 |
| 5,015,832 | 5/1991 | Filipski et al. | 235/462 |
| 5,177,559 | 1/1993 | Batchelder et al. | 356/237 |
| 5,227,642 | 7/1993 | Shimizu | 250/566 |
| 5,265,170 | 11/1993 | Hine et al. | 382/8 |
| 5,386,481 | 1/1995 | Hine et al. | 382/8 |
| 5,410,353 | 4/1995 | Cerda | 348/180 |
| 5,428,442 | 6/1995 | Lin et al. | 356/237 |
| 5,469,294 | 11/1995 | Wilt et al. | 359/436 |
| 5,515,452 | 5/1996 | Penkethman et al. | 382/141 |
| 5,542,002 | 7/1996 | Choate et al. | 382/112 |
| 5,553,168 | 9/1996 | Hennessey et al. | 382/276 |
| 5,572,325 | 11/1996 | Komatsu et al. | 356/401 |
| 5,800,906 | 9/1998 | Lee et al. | 428/192 |

FOREIGN PATENT DOCUMENTS

WO 97/24607   7/1997   WIPO.

OTHER PUBLICATIONS

Brochure: PST lot verification system, Progressive System Technologies.
Brochure: Lot and wafer identification machine from a company named RECIF.

*Primary Examiner*—Leo H. Boudreau
*Assistant Examiner*—Brian P. Werner
*Attorney, Agent, or Firm*—Klarquist Sparkman Campbell Leigh Whinston, LLP

[57] ABSTRACT

A wafer reader for reading scribes from the surface of semiconductor wafers uses a mirror assembly with a series of stationary mirrors spaced apart so that the mirrors can be inserted between wafers in a cassette. The mirror assembly enables a reader unit to read each scribe without displacing the wafer that it is reading or the adjacent wafers. The reader unit can include a single camera that moves relative to a stationary cassette assembly for holding a cassette or a moving cassette the moves past a fixed reading position of a single, stationary camera. Alternatively, the reader unit can include more than one stationary camera, each capable of reading more than one wafer in a cassette. The reader can use either bright or dark field lighting. In either case, each mirror in the mirror assembly re-directs light depicting a wafer scribe from the surface of an adjacent wafer to the camera assembly.

26 Claims, 5 Drawing Sheets

FIG. 4B
FIG. 4A
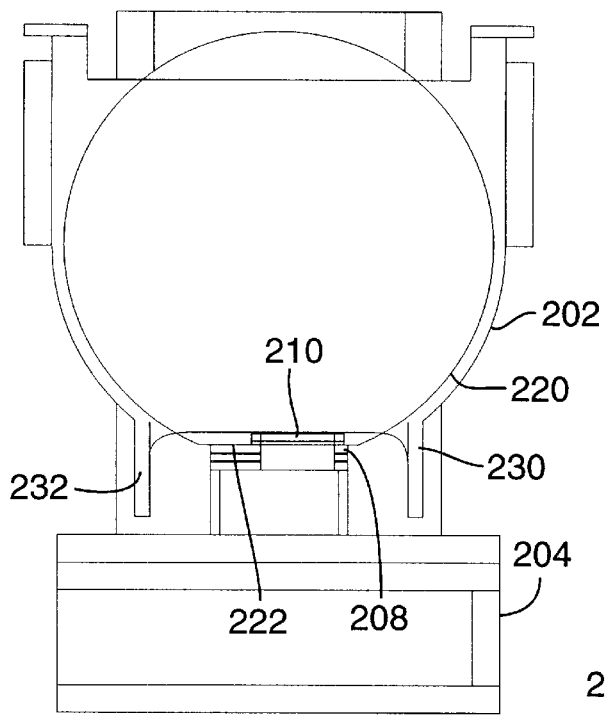
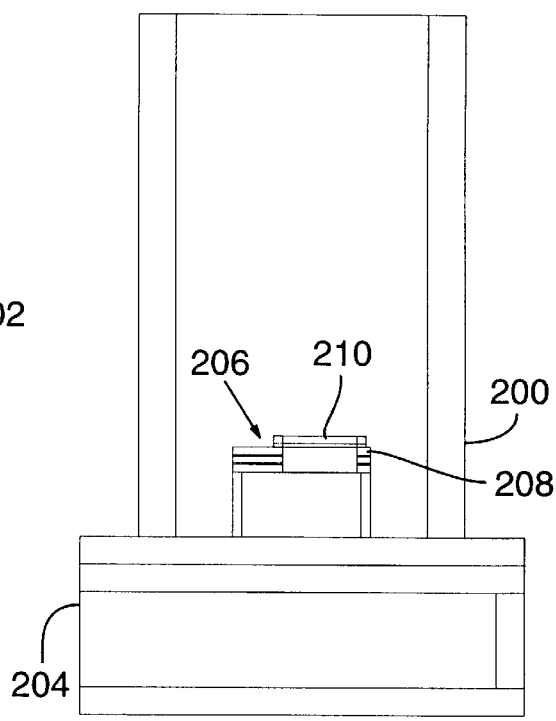

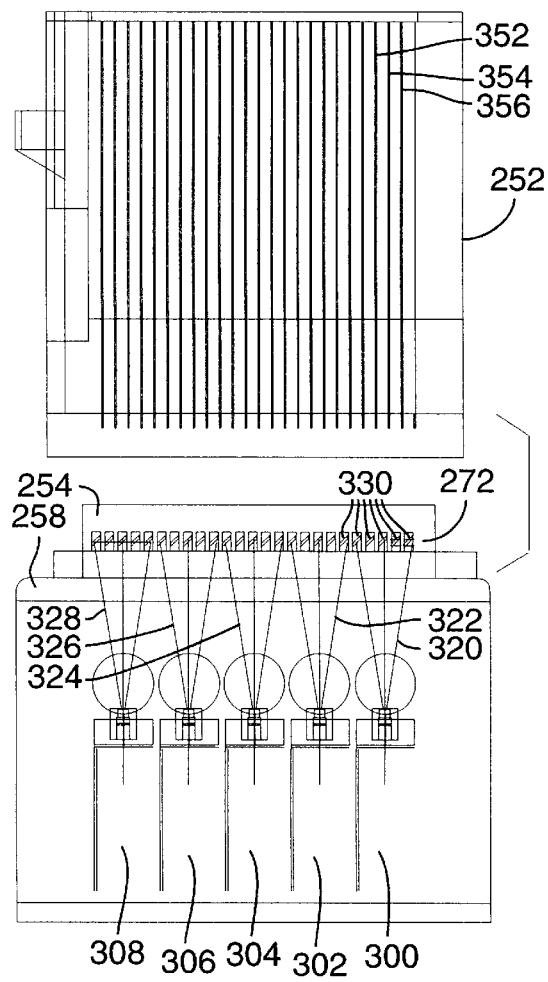
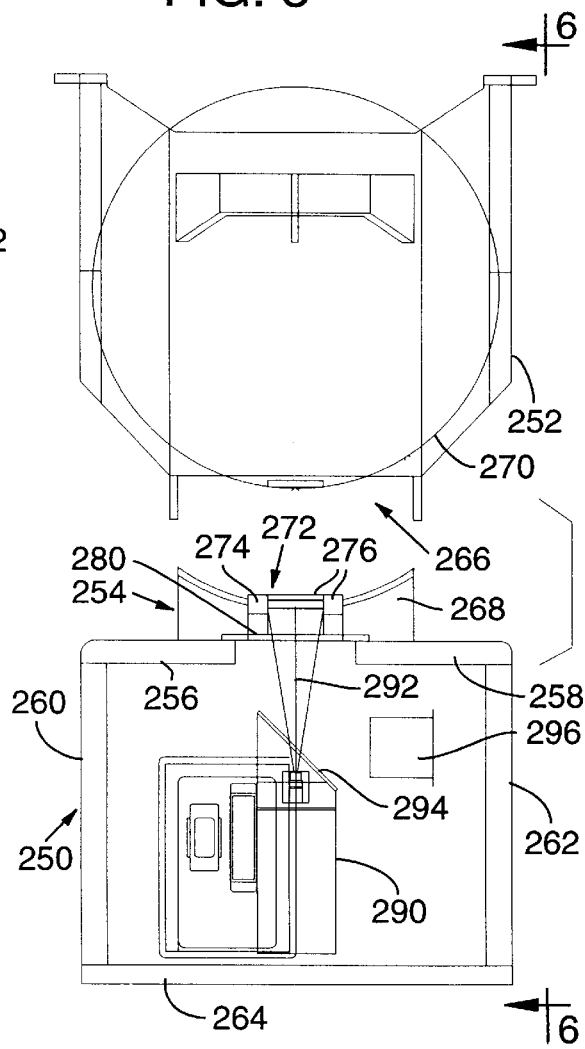

WAFER READER INCLUDING A MIRROR ASSEMBLY FOR READING WAFER SCRIBES WITHOUT DISPLACING WAFERS

FIELD OF THE INVENTION

The invention generally relates to devices used to read scribes from the surface of wafers, and more specifically, relates to a mirror assembly for reading the scribes without moving the wafers relative to each other.

BACKGROUND OF THE INVENTION

A wafer reader is a device used in the semiconductor manufacturing industry to read scribes from the surface of semiconductor wafers. A wafer scribe is an alpha-numeric code used to identify a wafer as it progresses through the manufacturing process. A scribe is marked onto the smooth surface of a wafer using a laser or diamond stylus. Typically the scribe is located on the surface of the wafer near a notch or flat edge on the perimeter of a wafer.

As they move from one manufacturing process to the next, wafers are commonly housed in a holding device called a cassette. One standard size cassette holds 25 wafers. A typical cassette has a series of shelves, equally spaced apart, such that each wafer rests on a shelf and is substantially parallel with the other wafers. The cassette is open on one side to expose a portion of the wafers and allow manufacturing equipment to access the wafers. Using the flat edge or notch on the wafer perimeter, a user or piece of equipment can align the wafers along the open side of the cassette.

Since cassettes are used extensively through the manufacturing process, the wafer reader should be able to read scribes from wafers located within the cassette. Some wafer readers available today can read scribes of wafers held in a cassette. One example of this type of wafer reader is described in U.S. Pat. Nos. 5,386,481 and 5,265,170 to Hine et. al. The wafer reader in these patents uses a wafer support that moves into position for each target wafer and displaces the adjacent wafers to expose the target wafer to read its scribe. While this type of wafer reader can read scribes from wafers in a cassette, it has a number of significant drawbacks.

One problem with the reader disclosed in the Hine patents is that it moves adjacent wafers apart to read scribes on the wafer surface. This particular aspect of the reader is disadvantageous because it tends to generate more particles, it is slow, and it requires relatively complex motion to read each wafer.

In the clean room environment of wafer processes, it is critical to avoid generating particles where possible. Readers that move one or more wafers to read a scribe generate particles by contacting adjacent wafers during the reading process.

An additional drawback of moving wafers during the reading process is that it takes more time for the reader to position itself to read each scribe. Since the wafer scribes may need to be read several times during manufacturing, a slower reading process will slow down the entire manufacturing process. In addition, a read operation that includes moving wafers requires more complex motion of the reader parts, making them more expensive and likely to fail.

SUMMARY OF THE INVENTION

The invention provides a wafer reader, a mirror assembly, and a method for reading scribes that address the above-drawbacks and has number of advantages. One aspect of the invention is a mirror assembly for a wafer reader that enables the wafer reader to read a wafer scribe from a target wafer without displacing it or the adjacent wafers. The mirror assembly is comprised of a series of mirrors mounted to a mirror mount via a series of mirror supports. The mirrors are aligned on the mirror assembly and spaced apart to enable wafers to be inserted between adjacent mirrors.

An implementation of the mirror assembly is specifically designed so that wafers exposed at the open end of a standard cassette can be inserted between adjacent mirrors without displacing the wafers. When positioned at the edge of the cassette, each mirror re-directs light from the surface of an adjacent wafer along a corresponding line of sight. A reader unit can then read the scribes depicted in the light reflected from each mirror by positioning a cameras field of view to intersect with the line of sight of each mirror.

The reader unit can use either bright or dark field lighting to read scribes using the mirror assembly. For bright field lighting, a bright field light source directs coaxial light to each mirror in the mirror assembly. The mirror assembly directs coaxial light in a direction normal to the surface of the wafer. The adjacent mirror directs light reflected normal to the surface of the wafer, namely, the light reflected from the smooth surface around the wafer scribe, along the line of sight of the mirror. This reflected light depicts the wafer scribe as dark lines on a bright background. For dark field lighting, a dark field light source directs light to the surface of the wafer at an angle that is not normal to the wafers surface (i.e., non-coaxial light). The adjacent mirror directs light reflected normal to the surface of the wafer, namely, light scattered from the scribe, along the line of sight of the mirror. This reflected light depicts a wafer scribe as bright lines on a dark background. In either case, each mirror reflects light normal to the surface of the adjacent wafer to a line of sight.

A camera assembly with a field of view that intersects this line of sight captures an image of the scribe. The camera assembly can be implemented as a single camera that moves relative to a stationary cassette assembly holding a cassette, or as a single camera that remains in a fixed reading position relative to a moving cassette assembly. As yet another alternative, both the camera assembly and the cassette assembly can be fixed, and the camera assembly can include more than one camera for reading two or more wafers simultaneously.

The wafer reader summarized above has a number of advantages over conventional reader designs. For instance, the wafer reader does not displace the target wafer or adjacent wafers to perform a read operation on the target wafer. This aspect of the reader reduces particle generation and the time required to read the wafers in a cassette. It also simplifies the design of the parts used to position the camera assembly or the cassette for read operations.

Further features and advantages of the invention will become apparent with reference to the following detailed description and accompanying drawings.

BRIEF DESCRIPTION OF THE DRAWINGS

FIG. 4A is top plan view of a cassette assembly for a vertical wafer reader including a cassette shelf for supporting a cassette.

FIG. 4B is a top plan view of the cassette assembly of FIG. 4A showing a cassette positioned on the cassette assembly for reading operations.

FIG. 5 is an end view of a horizontal reader unit with multiple stationary cameras and a stationary cassette assembly, and a cassette positioned just above the cassette assembly.

FIG. 6 is a side view of the reader unit of FIG. 5 taken along line 6—6 with five stationary cameras, a stationary cassette assembly, and a cassette positioned just outside the cassette assembly.

DETAILED DESCRIPTION

As summarized above, the invention provides a wafer reader that reads wafer scribes without moving wafers relative to each other. The invention also includes a mirror assembly and a method of using the mirror assembly to read wafer scribes. Though the precise structure for holding wafers for read operations is not critical to the invention, the implementations of the wafer reader described below read scribes from wafers housed in a cassette. The invention is not limited to reading wafers in a standard cassette, however, because it can be easily adapted to read wafers in other wafer holding devices as well.

There are several possible ways to implement the wafer reader so that it reads wafers in a standard wafer cassette, including: moving a camera assembly relative to the cassette; moving the cassette relative to a stationary camera, or using more than one stationary camera to read the wafers in a cassette. The specific design can also vary depending on the orientation of the wafers. For example, the wafers can sit horizontally, vertically, or at some other angle relative to the ground. Below, are described examples of alternative implementations of the invention. It is important to note that the invention is not limited to these specific designs and can be implemented in alternative ways.

Figure 1:
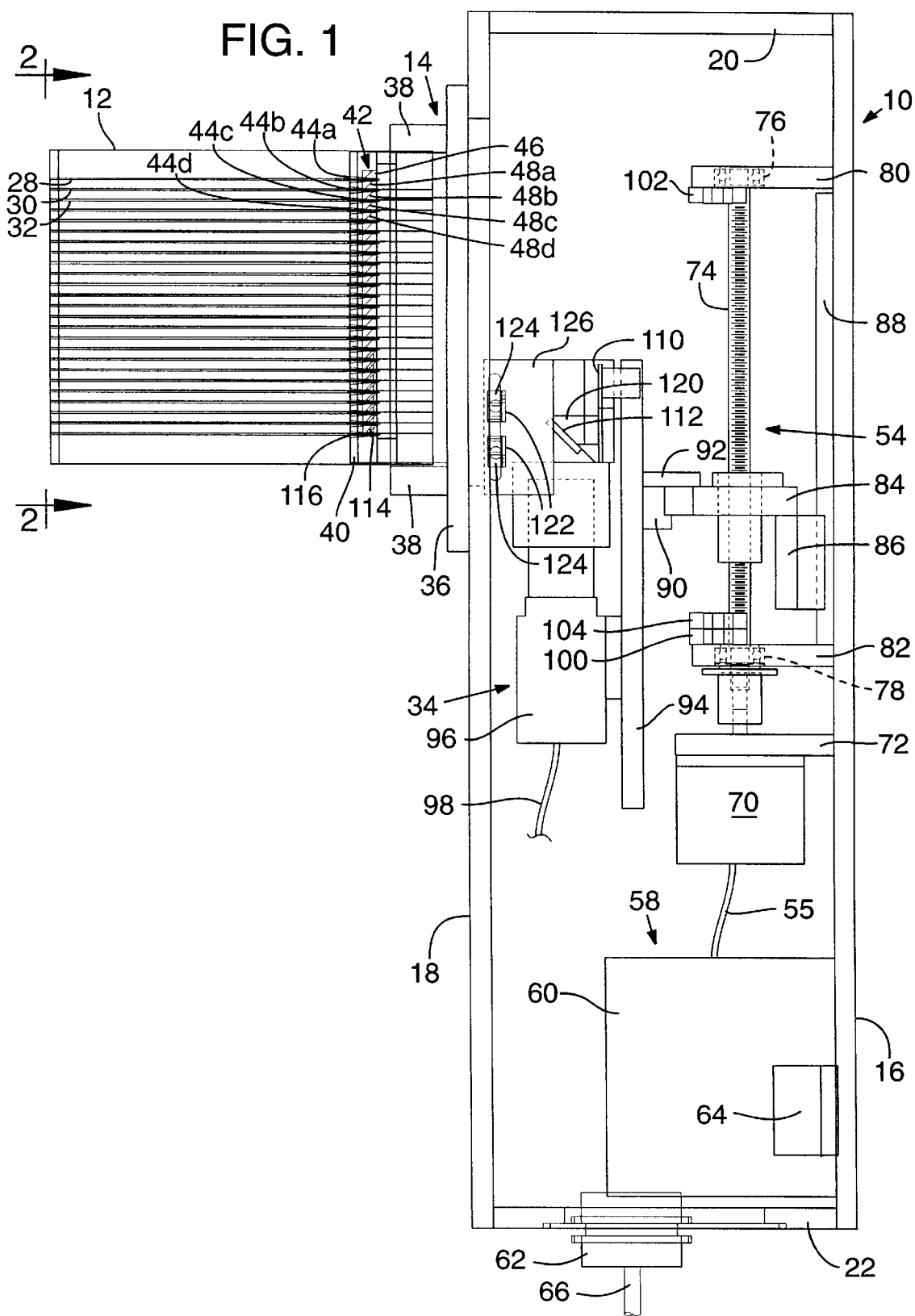
FIG. 1 is a side elevation view of a horizontal wafer reader according to an embodiment of the invention.

FIG. 1 is a side view of one implementation of a wafer reader. FIG. 1 specifically shows a horizontal wafer reading unit 10 and a wafer cassette 12 resting on the cassette assembly 14 of the reader unit 10. This reader unit is referred to as a horizontal because the read position of the reader unit 10 is designed to move horizontally, or laterally, relative to the direction of gravity to read each wafer. In addition, the cassette is positioned horizontally on the cassette assembly such that the wafers (e.g., 28–32) in the cassette are vertical during read operations, or in other words, in the direction of gravity. The cassette 12 and cassette assembly 14 shown in FIG. 1 remain in a fixed position during read operations, and the camera assembly 34 for reading scribes moves laterally relative to the wafers in the cassette.

The housing of the reader unit 10 is comprised of a top plate 18 and a base, or bottom, plate 16, and two end plates 20, 22. The cassette assembly is mounted to the top plate 18 of the housing via a cassette mounting plate 36. Extending from the mounting plate 36, a cassette guide 38 aligns the cassette on the reader unit 10. The cassette assembly shown here includes both a locating nest 40 and a mirror assembly 42. Both the mirror assembly and wafer locating nest are shown in more detail in FIGS. 2A–2C and described further below.

The wafer locating nest 40 has a series of grooves, such as noted at 44A–D, designed to locate and support the wafers relative to the mirror assembly 42. The mirror assembly 42 is comprised of a mirror mount 46 and a series of mirrors such as noted at 48A–D, mounted on the mirror mount. When a cassette is properly positioned between the cassette guides 38, the force of gravity causes the wafers to rest in the grooves of the wafer locating nest. The grooves align the wafers in the wafer locating nest and position them in the slots between the mirrors in the mirrors assembly 42.

The interior of the wafer reader unit 10 includes three primary components: a drive assembly 54, a camera assembly 34, and a drive control 58. In this particular implementation, the drive control 58 is a stepper drive that controls the position of the camera assembly 34 by using the drive assembly 54 to move the camera assembly linearly in a predetermined sequence of steps.

The stepper drive 60 is mounted inside the reader unit 10 next to a connector interface 62 and a power supply 64. The specific stepper drive used in this implementation is a CMD-40, manufactured by American Precision Industries. This stepper drive operates in response to control signals from a personal computer (PC). The PC executes stepper software and issues control signals to the stepper drive in the reader unit via a control cable 66.

The drive assembly 54 moves the camera assembly in response to control signals from the drive control 58 via cable 55. The drive assembly includes a drive motor 70 that rotates a power screw 74, which in turn, moves the camera assembly along a linear bearing. The drive motor 70 is mounted on a motor mount 72 fixed to the bottom plate of the reader unit 10. The power screw 74 rides on bearings on each end 76, 78, which are housed in bearing mounts 80, 82 attached to the base 16 of the reader unit. The power screw 74 and bearings 76, 78 are both commercially available parts.

As the stepper drive turns the power screw 74, the power screw moves a nut mount 84 along the power screw. At its base, the nut mount 84 is attached to a linear bearing mount 86, which rides along a linear bearing 88 on the base 16 of the reader unit. The top of the nut mount 84 has adjustable components 90, 92 that connect a camera mount 94 in the camera assembly 34 to the drive assembly 54. The adjustable components allow a user to adjust the position of the camera assembly relative to the cassette assembly.

The drive assembly 54 includes three sensors for detecting the position of the camera assembly 34. Specifically, the sensors detect the presence of a flag attached to the camera assembly, and this flag enables the drive control 58 to detect when the camera assembly has reached a reference point, and the positive and negative limits of its range of motion (the opposite end limit positions). The drive control 58 uses one of the sensors, called the home sensor, to detect when the camera assembly is at a reference point called the home position. The drive system 58 uses the other two sensors (the positive and negative sensors) to detect a positive and negative limit on the travel path of the camera assembly.

In the reader unit of FIG. 1, these sensors are implemented with light sensors that detect the present or absence of a flag between an optical emitter and receiver. The positive and negative sensors 100, 102 are attached to the inside of the bearing mounts 82, 80 in the drive assembly. The home sensor 104 is attached to the bearing block mount 82, adjacent to the positive sensor 100. While this particular embodiment uses light sensors to detect the position of the camera assembly, any of a variety of conventional sensors can be used to detect the position of the camera assembly. The specific light sensors used in this implementation are EE-SX670 manufactured by Omron.

The camera assembly 34 is comprised of a camera 96, dark and right field light sources and related accessories for capturing an image of a wafer scribe reflected from each mirror in the mirror assembly. In this particular implementation, the camera is a TM-7EX from Pulnix with a standard 25 mm C-mount lens. The camera sends images of the wafer scribes to a vision controller that converts the image of a scribe into an alpha-numeric text code using conventional optical character recognition vision technology. In the reader unit of FIG. 1, the camera sends images of the scribes to vision card in the PC via the camera cable 98. The specific type of vision card used to implement the vision controller is an Acumen Optical Character Recognition card (OCR card). The PC receives the text output representing each wafer scribe from the vision card and writes it to a file.

The reader unit shown in FIG. 1 is equipped with both bright and dark field light sources. The bright field light source is implemented with a light board 110 attached to the camera mount 94. The bright field light source provides coaxial light to the wafer surface via a beam splitter 112. Specifically, the light travels from the bright field light source 110, through the beam splitter 112, and into a mirror (e.g., 114) in the mirror assembly 42. The mirror assembly 42 then reflects the coaxial light in a direction normal to the surface of the wafer 116 adjacent to the mirror 114 in the mirror assembly 42. The mirror 114 re-directs light from the surface of the wafer 116 back to the beam splitter. The beam splitter, which is mounted to the camera assembly 34 via a beam splitter mount 120, reflects light from the mirror 114 to the camera 96.

The dark field light source is implemented with two swivel light boards 122 attached to light swivels 124. The light swivels 124 are attached to the camera assembly via a swivel mount 126. The light swivels 124 and swivel mounts 126 can be used to adjust the direction of a light originating from the dark field light source. In contrast to the bright field light source, the light originating from the dark field light source is not coaxial (non-coaxial) with the light reflected into the camera. The dark field light is directed to the surface of wafer at an angle that is not normal to the surface of the wafer. The scribe imperfections in the surface of the wafer scatter the dark field light and reflect some light in a direction normal to the surface of the wafer. The mirror (e.g., 114) in the mirror assembly 42 re-directs this light to the beam splitter 112, which directs it to the camera 96. Since the mirror 114 and beam splitter redirect light reflected from the scribe back to the camera, the dark field light source causes the background of the scribe to look dark and the scribe itself to look bright.

Both the bright and dark field light sources operate under the control of a light controller. The light controller is implemented using a light card installed in the PC. This light controller and the light boards used to implement the bright and dark field light sources are manufactured by Acumen.

A typical sequence of operation of the wafer reader shown in FIG. 1 is as follows. First, an operator begins by aligning the wafers in a cassette 12 using the flat edges or notches in the wafers. Next, the operator places the cassette 12 filled with wafers into the wafer locating nest 40 on the reader unit 10. The cassette guides 38 on the top of the reader unit help position the cassette 12 properly on the wafer locating nest. Next, the operator instructs the device to read by entering a command on the PC attached to the reader unit.

To read each scribe, the stepper drive moves the camera assembly linearly into positions to read each wafer scribe. Each of the mirrors in the mirror assembly 42 reflects light from the surface of an adjacent wafer to a line of sight corresponding to the mirror. When the stepper drive moves the camera assembly to a position for reading a target wafer (the read position for the target wafer), the beam splitter intersects with the line of sight of the mirror adjacent to the target wafer. The field of view of the camera includes the reflective surface of the beam splitter, and thus, the light from the wafer depicting the wafer scribe is in the cameras field of view. In other words, the field of view of the camera intersects with the line of sight the mirror adjacent to the target wafer. Once in the read position, the camera reads the wafer scribe from the target wafer by capturing an image of the wafer scribe. The light reflected back to the camera either depicts the scribe marks as dark lines on a bright background, for bright field lighting, or bright lines on a dark background, for dark field lighting. The camera transmits a still image of the scribe to the vision card in the PC. The vision card then converts the image into an alpha numeric code using a conventional OCR scheme. The PC receives the wafer scribes as text input from the vision card and writes the alpha numeric codes into a text file. The name of this text file can be input by the operator, scanned in with a bar code reader, or generated automatically. After the stepper drive has stepped through the read position of each wafer in the cassette, the scan is complete for the cassette, and the cassette is removed. The reading process can be repeated in the same manner for each cassette placed on the cassette assembly of the reader unit.

A particularly advantageous feature of this implementation is the ability of the reader to read each scribe from the surface of the wafers in the cassette without displacing the target wafer or any of the adjacent wafers. The unique design of mirror assembly 42 allows the reader unit to perform each read operation without displacing a wafer. The cassette assembly, including the mirror assembly, is illustrated in more detail in FIGS. 2A–2C.

Figure 2A:
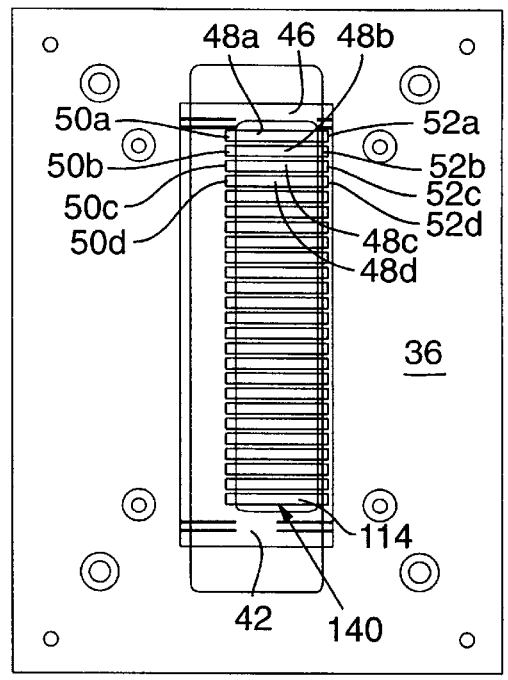
FIG. 2A is an enlarged top plan view of a mirror assembly for a wafer reader taken generally along line 2—2 in FIG. 1.

FIG. 2A is a top plan view illustrating the mirror assembly 42 on the cassette mounting plate 36 without the wafer nest 40 or cassette guides 38. The mirror assembly 42 comprises a mirror mount 46 and a series of mirrors (48a–d) coupled to the mirror mount via mirror supports 50a–d, and 52a–d. The mirror mount 46 is a metal part, preferably made of anodized aluminum. An oblong and nearly rectangular aperture 140 is bored through the mirror mount 46. A row of angled mirror supports 50a–d, 52a–d extend along each of the long sides of the aperture 140 in the mirror mount. Corresponding angled mirror supports on each side of the aperture (such as 50a and 52a) support an individual, rectangular mirror (such as 48a). Adjacent mirror supports (such as 50a and 50b) in each of the rows of mirror supports are spaced apart slightly so that a wafer can be inserted between adjacent mirrors (such as 48a and 48b). This spacing between adjacent mirrors forms a slot for a wafer, and the slots are spaced apart from each other so that wafers in a cassette can be inserted without displacing the wafers.

Figure 2B:
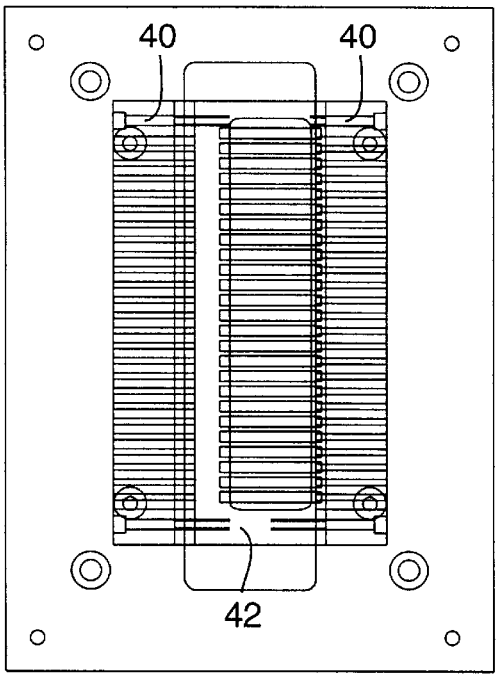
FIG. 2B is an enlarged top plan view of a cassette assembly with a mirror assembly and a wafer locating nest taken generally along line 2—2 in FIG. 1.

FIG. 2B is a top plan view of the cassette assembly including both the mirror assembly 42 and the wafer locating nest 40. As shown in this top view, the wafer locating nest 40 forms a series of grooves aligned with the slots between the mirrors in the mirror assembly. The wafer locating nest is attached to the cassette assembly using conventional fasteners such as screws. While the reader unit of FIG. 1 has a wafer locating nest, a wafer locating nest is not necessary to implement the invention. However, the wafer nest is especially useful in a horizontal reader. In a horizontal wafer reader such as the one shown in FIG. 1, the wafer surfaces are vertical, parallel (or nearly parallel) to gravity when a cassette is positioned on the wafer reader. Since the open end of the cassette faces in the direction of gravity, the cassette does not retain the wafers when the cassette is placed in the cassette assembly for read operations. Instead, the wafers settle by gravity into the grooves of the wafer locating nest 40, which supports the wafers and ensures that they are properly aligned adjacent to a mirror in the mirror assembly.

With or without a wafer nest, each wafer in the cassette loaded on a cassette assembly is located next to a mirror in the mirror assembly. When a wafer is fully inserted into the mirror assembly (e.g., when the cassette is fully engaged on the cassette assembly), the surface of the wafer including the scribe faces toward the adjacent mirror in the mirror assembly. Light reflected normal to the surface of the wafer is directed toward this mirror, which in turn, reflects the light along a line of sight of the mirror.

Figure 2C:
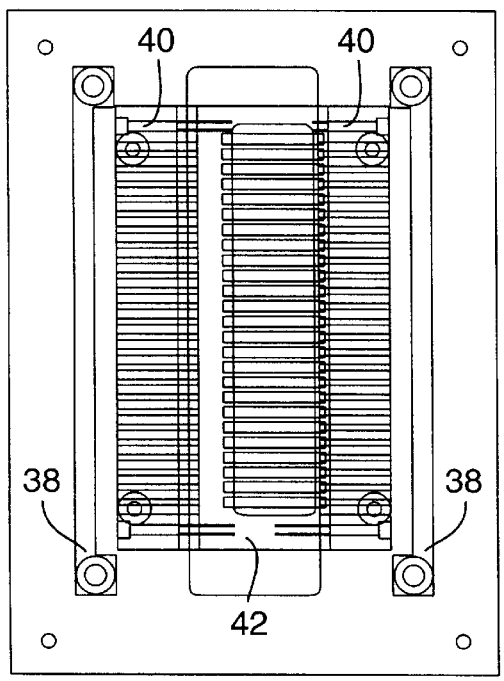
FIG. 2C is an enlarged top plan view of a cassette assembly with a mirror assembly, a wafer locating nest and cassette guides taken generally along line 2—2 in FIG. 1.

FIG. 2C is a top plan view illustrating the cassette assembly of FIG. 1 including the mirror assembly 42, the wafer locating nest 40, and the cassette guides 38. The two cassette guides 38 are metal parts preferably made of anodized aluminum, and are attached to the cassette assembly using conventional fasteners such as screws. When an operator, or robot, places a cassette into the cassette assembly, the cassette guides properly align the cassette on the cassette assembly.

Figure 3:
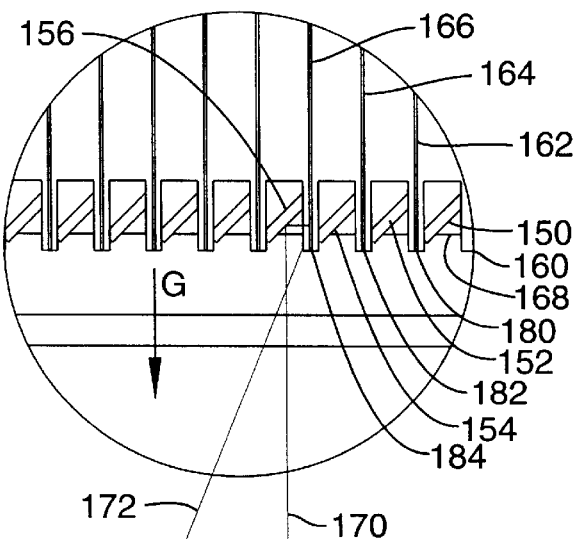
FIG. 3 is a magnified side view of a portion of a mirror assembly with the wafers from a cassette inserted into the slots between the mirrors in the mirror assembly.

FIG. 3 illustrates a magnified side view of the mirror assembly 42 shown in FIG. 2A. As shown in FIG. 3, the mirror assembly 42 includes a series of mirrors 150, 152, 154, 134 oriented in substantially the same direction. In other words the surface normals of each of the mirrors are substantially parallel. When a cassette is inserted in the cassette assembly of the reader unit, each of the mirrors is positioned adjacent to a corresponding wafer 160, 162, 164, 166 in the cassette. The mirrors are mounted on angled mirror supports (e.g., 168) such that the mirrors reflect coaxial light that passes through the aperture 140 in the mirror mount to the surface of the wafer and reflect light from the surface of the wafer back through the aperture to the beam splitter in the cassette assembly. The wafers in the cassette actually fit in the slots (for example, 180–184) between adjacent mirrors in the mirror assembly and are not displaced by the mirrors or any other structure in the mirror assembly during a read operation. In some implementations, the wafer locating nest displaces the wafers slightly as the wafers settle into the grooves of the nest. FIG. 3 shows the direction of gravity, G, for a horizontal wafer reader, where gravity causes the wafers to settle into the wafer nest. During the reading process, however, the wafers do not need to be displaced to read the wafer scribe from the surface of each wafer.

It is important to note that the wafer locating nest is not a critical element of the mirror assembly, especially in a vertical reader design where a wafer locating nest is not needed. In a vertical reader, the planar surfaces of the wafers are horizontal, and are supported by the shelves in the cassette as opposed to the grooves of a locating nest.

In addition to illustrating the detailed structure of a mirror assembly, FIG. 3 also illustrates an example of how dark and bright field light rays strike the surfaces of the mirrors and wafers. The bright field light source provides coaxial light as depicted by light ray 170. The coaxial light ray directed to mirror 156 reflects from the mirror in a direction that is substantially normal to the surface of the wafer 166. The imperfection of the wafer scribes scatter incoming light rays whereas the smooth surface around the wafer scribe reflects light in a direction normal to the surface of the wafer and back toward the mirror 156. The mirror 156 reflects this light back along the path of the coaxial light ray 170. Since the light reflected from the surface of the wafer around the scribe gets reflected back to the camera, the wafer scribe appears as dark marks on a bright background.

In contrast to the light rays from the bright field light source, the light rays 172 from the dark field light source are directed to the surface of a wafer 166 at an angle that is not normal to the surface of the wafer. For simplicity, this type of light ray is referred to as non-coaxial light. The imperfections of the wafer scribe scatter the non-coaxial light such that some of the incoming non-coaxial light rays get reflected normal or substantially normal to the surface of the wafer and into the adjacent mirror 156. The mirror 156 directs this light along the coaxial light path depicted by the light field light ray 170 in FIG. 3. The smooth, reflective surface of the wafer around the wafer scribe does not reflect the incoming dark field light rays in a direction normal to the surface of the wafer, but rather reflects the light away from the coaxial light path. Since the light from the wafer scribe is reflected back along the coaxial light path, the reflected light depicts the wafer scribe as bright marks on a dark background.

In this particular implementation of the mirror assembly, each of the mirrors is oriented at an angle such that the surface normal vectors for each mirror are substantially parallel (i.e., all point in the same direction). Thus, the coaxial light path for each mirror and its adjacent wafer are substantially parallel. The coaxial light ray corresponding to the read position of each wafer is substantially coincident with the line of sight of the mirror adjacent to the target mirror. Each of the mirrors in the mirror assembly reflect light from the wafer that is normal to the wafer surface along the line of sight of the mirror and its corresponding wafer.

Since the wafer scribe is depicted in the coaxial light reflected along the line of sight for each of the wafers, the wafer reader can capture the wafer scribe by positioning the field of view of the camera to intersect with the line of sight of each of the wafers. This can be accomplished by moving the camera relative to the mirror assembly as shown in FIG. 1 or moving the mirror assembly relative the camera as described further below. In addition, multiple cameras can be positioned such that each of the cameras have a field of view that intersects with one or more lines of sight of mirrors in a mirror assembly. Using multiple cameras has the advantage that no moving parts are necessary to read each of the wafers in the cassette because each of the cameras can read a subset of the wafers in the cassette without moving either the cassette or the cameras.

As alluded to above, there are a number of different ways to implement the wafer reader of the invention using the mirror assembly of FIGS. 2A–C and FIG. 3. The reader unit shown in FIG. 1 is referred to as a horizontal reader unit because the wafers are oriented vertically and the camera assembly moves horizontally. An alternative implementation is a vertical reader unit, where the wafers are oriented horizontally and the camera moves vertically. In a vertical reader unit, the parts internal to the reader unit can be substantially the same as in a horizontal reader unit of the same type (here type refers to how the camera assembly is designed to capture images of each wafer scribe such as multiple stationary cameras, single moving camera, single camera-moving cassette assembly). However, the cassette assembly supports the cassette differently, and therefore, can have a different structure in the horizontal vs. vertical reader implementation.

FIGS. 4A and 4B illustrate a top plan view of a cassette assembly of a vertical reader unit for comparison with the cassette assembly of FIG. 1. In a vertical reader unit, a cassette can be supported on the cassette assembly by placing the cassette on a cassette shelf 200 as shown in FIG. 4A. The wafer locating nest shown in FIGS. 1 and 2B is not necessary in a vertical reader because the wafers in the cassette are positioned horizontally and rest on the shelves within the cassette. To set up the wafer reader to read the wafers in a cassette, the operator (or a automated system such as a robot) places a cassette 202 (see FIG. 4B) on the shelf 200 in FIG. 4A and slides the cassette 202 towards the body 204 of the reader unit. Like the mirror assembly in the implementation shown in FIG. 1, the mirror assembly 206 of the vertical reader unit includes a mirror mount 208 and a series of mirrors 210 mounted to the mirror mount.

FIG. 4B illustrates the relationship between a wafer 220 with a flat edge 222 with the mirror 210 in a mirror assembly 208. The flat edge 222 of the wafer 220 is inserted toward the mirror assembly such that the mirror 210 extends over the surface of the wafer 220 near the flat edge 222. The cassette 202 has two lateral arms 230, 232 that help align the cassette and the wafers in the cassette with the mirror assembly on the reader unit.

The cassette assembly shown in the horizontal reader of FIG. 1 can be used for other types of horizontal readers. Similarly, the cassette assembly shown in FIGS. 4A–B can be used for other types of vertical readers. The cassette assembly for a horizontal reader includes the wafer locating nest but not the cassette shelf. Conversely, the cassette assembly for the vertical reader has a cassette shelf, but not the wafer locating nest. Both cassette assemblies can be used for a variety of types of reader units such as: 1) a reader unit with a single moving camera; 2) a reader unit with a single, stationary camera and a moving cassette; and 3) a reader unit with multiple stationary cameras.

The reader unit of FIG. 1 shows a reader unit where a single camera moves relative to the cassette assembly. One alternative implementation is to use more than one stationary camera, where each camera can read a scribe from one or more wafers at a time. FIGS. 5 and 6 illustrate a reader unit with multiple stationary cameras for reading the wafer scribes from the wafers in a cassette. Both FIGS. 5 and 6 show the cassette located just above the reader unit 250 to show the detail of the cassette assembly 254 relative to the cassette 252.

FIG. 5 illustrates an end view of a horizontal reader unit 250 with multiple cameras. The housing of the reader unit 250 is comprised of first and second top plates 256 and 258, side panels 260, 262, and bottom panel 264. This particular design is like the horizontal reader design shown in FIG. 1 in that the wafers are designed to be oriented vertically when positioned for read operations on the reader unit. Since the open end 266 of the cassette 252 is directed downwardly, the cassette assembly 252 of the reader unit 250 has a wafer locating nest 268 to support the wafers (e.g., 270) in the cassette 252 for read operations. The mirror assembly 272 includes a mirror mount 274 and a series of mirrors (e.g., 276), and is mounted next to a glass cover 280 extending between the two top pieces 256, 258 of the reader units housing.

The camera assembly 290 in this implementation is fixed in the midsection of the reader unit 250 and includes multiple cameras. The relative positioning of the multiple cameras is shown in FIG. 6. FIG. 5 shows the field of view 292 of the cameras in the camera assembly 290 with respect to the width of a each mirror (e.g., 276) in the mirror assembly 272. Note that the field of view 292 of the cameras extends generally across the entire width of the mirror 276 in the mirror assembly. The field of view can be adjusted by adjusting the lenses of the cameras in the camera assembly 290.

The camera assembly includes a beam splitter 294 designed to reflect light from a light source toward the mirrors in the mirror assembly and allow light reflected back from the mirrors in the mirror assembly to pass into the cameras in the camera assembly 290.

The light source in this implementation is a collimator 296. A collimator is a device for providing a series of parallel beams of light. In this particular implementation, the collimator provides beams of light to illuminate each of the wafers in the cassette with bright field lighting via the mirrors in the mirror assembly 272.

FIG. 6 illustrates a side plan view of the reader unit of FIG. 5, including five stationary cameras 300–308. Each of these cameras is attached to the reader unit such that they remain fixed and stationary during read operations. These cameras can each read more than one wafer at a time, and together, can read all of the wafers at once without any moving parts. As an aside, it is possible to use multiple, moving cameras using a combination of the features shown in FIGS. 1, 5 and 6. In this case, the cameras in the camera assembly could read multiple scribes at each step of the stepper drive.

FIG. 6 shows the relationship between the field of views 320–328 of each of the cameras 300–308 and the mirrors (e.g., 330 for camera 300) in the mirror assembly 272. FIG. 6 also shows the cassette 252, including several wafers 352–334 positioned just outside the cassette assembly 254 of the reader unit to show the relationship between each water and a corresponding mirror in the mirror assembly prior to positioning for reading.

The field of view of each of the stationary cameras 300–308 in FIG. 6 intersects with a line of sight with five mirrors in the mirror assembly (e.g., 330 for camera 300). When the cassette 252 is positioned to engage the cassette assembly 254 on the reader unit the wafers such as wafers 352–334 in the cassette rest in the grooves of the wafer nest and fit in the slots between each of the mirrors in the mirror assembly 272. The relationship between the wafers and the mirrors in the mirror assembly is similar to that shown in FIG. 3 and described in detail above.

The principle advantages of a reader unit with multiple stationary cameras are the absence of moving parts to minimize particle generation and the ability to read wafer scribes faster because the reading process requires no move and wait sequences as in the implementation shown in FIG. 1.

Figure 7:
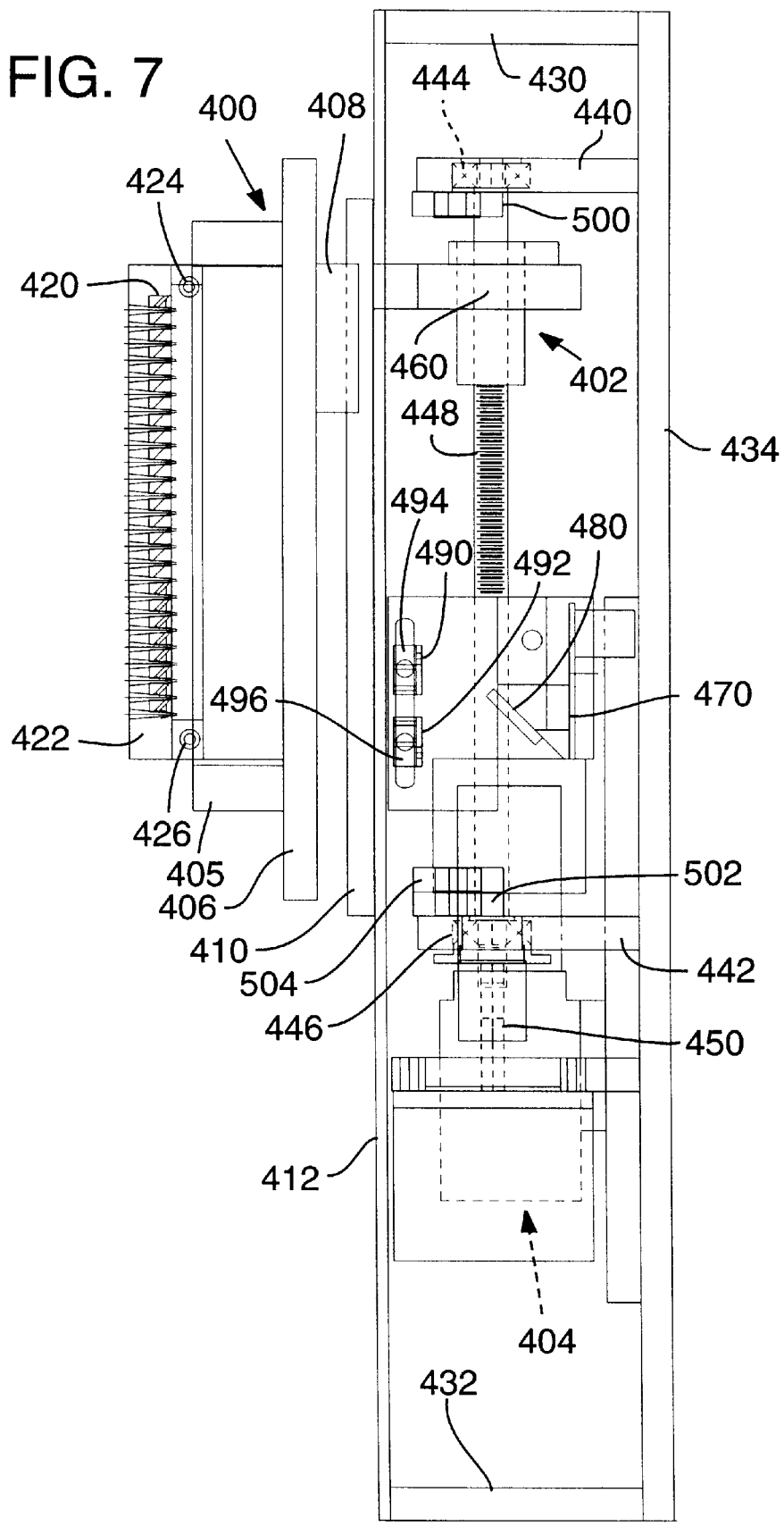
FIG. 7 is a side elevation view of a horizontal reader unit with a single, stationary camera and a moving cassette assembly that moves relative to a fixed reading position of the reader unit.

As described above, the wafer reader unit can be implemented such that the camera moves relative to the mirror assembly, or the mirror assembly moves relative to a stationary camera assembly. FIG. 7 is a side elevation view illustrating a wafer reader in which the mirror assembly moves relative to a stationary camera. Many of the components shown in this reader design are similar to these shown and described for the reader of FIG. 1. Thus, the following description does not elaborate on the details of the parts that are similar to FIG. 1 and places particular emphasis on the differences between the wafer reader units of FIGS. 1 and 7.

The reader unit of FIG. 7 includes a movable cassette assembly 400, a drive assembly 402, and a static camera assembly 404 shown in dashed lines. The cassette assembly 400 includes a cassette nest 405 mounted onto a cassette mount plate 406. Enabling the cassette assembly to move linearly, the cassette mount plate 406 is attached to a linear bearing mount 408 that rides along a linear bearing 410 attached to the top plate 412 of the reader unit. The cassette assembly also includes a mirror assembly 420, similar that shown in FIG. 2A and a wafer locating nest 422, similar to that shown in FIG. 2B. Both the mirror assembly 420 and the wafer locating nest 422 are mounted to the cassette nest 405 via conventional fasteners 424, 426.

The drive assembly 402 and camera assembly 404 are enclosed inside the reader unit housing. The reader unit housing is comprised of the top plate 412, two end plates 430, 432 and a bottom plate 434. The bottom plate 434 forms the base of the reader unit and is typically oriented horizontal, although the precise orientation is not critical to the design.

The drive assembly 402 is mounted to the bottom plate 434 of the reader unit via bearing mounts 440 and 442, which house bearings 444, 446. A power screw 448 of the drive assembly rides in the bearings 444, 446 under the control of a stepper drive and stepper motor 450. As it rotates, the power screw slides a nut mount 460 axially of the power screw 448. Connected to the camera assembly at the linear bearing mount 408, the nut mount moves the cassette assembly along the linear bearing.

Like the design shown in FIG. 1, the reader unit in FIG. 7 includes both bright and dark field light sources. The bright field light source is implemented with a light board 470 that directs coaxial light toward a mirror in the mirror assembly via a beam splitter 480. The stepper drive 450 moves the cassette assembly along a linear path such that each mirror in the mirror assembly steps into a fixed read position in a predetermined sequence defined in the stepper software. To read each wafer, the stepper drive positions the line of sight of each mirror assembly to coincide with the fixed read position of the camera assembly.

The dark field light sources 490, 492 are implemented as swivel light boards attached to swivel mounts 494 and 496. The dark field light sources direct non-coaxial light toward the surface of a target wafer in the fixed read position. The light scattered from the scribe on the wafer in the read position is reflected into the adjacent mirror in the mirror assembly and directed to the beam splitter 480 in the camera assembly. The beam splitter directs the light into the lens of the camera in the camera assembly 404.

As in FIG. 1, the drive assembly 402 includes three sensors used to control the position of the cassette assembly relative to the fixed read position of the reader unit. Positive and negative sensors 500, 502 are positioned adjacent to the bearing mounts at each end of the power screw and detect when the nut mount 460 of the drive assembly has traveled to its farthest and nearest extent relative to each end or the power screw 448. A home sensor 504 is positioned adjacent to the negative sensor 502 and is used to detect a reference point for the drive system of the reader assembly. During the reading process, the stepper drive orients itself relative to the reference point using the home sensor 504 and steps through a predetermined reading sequence in which it positions each wafer at the fixed read position.

Using either a dark field or light field lighting approach, the wafer reader reads a wafer scribe from the surface of each wafer by capturing the light reflected from each wafer when it is positioned in the fixed read position of the reader unit. Aside from the difference that a cassette assembly moves relative to a fixed camera, the operation of this implementation is similar to the operation of the implementation in FIG. 1 described above.

Though I have described my wafer reader invention in detail with reference to a series of alternative implementations, it is important to note that the invention is not limited to the specific implementations described above. It may be either a horizontal or a vertical reader. The horizontal reader unit uses a wafer locating nest to align and support wafers on a cassette assembly. In contrast, a vertical reader unit does not require a locating nest, but instead, relies on the cassette to support the wafers during reading operations. The precise orientation of the wafers in the cassette is not critical to the invention. The flexibility in the wafer reader design allows it to be integrated with semiconductor processing machines that orient the wafers either vertically or horizontally, as well as other orientations.

Another design variation highlighted above is the way in which the reader positions the camera and wafers relative to each other. In FIG. 1, a single camera moves relative to stationary wafers on a cassette assembly. In FIG. 7, the cassette moves relative to a single, fixed camera. In FIGS. 5–6, multiple cameras are used to read wafer scribes without moving the cameras or the cassette. In each of these implementations, the reader unit can read the wafer scribe from each wafer in a cassette without displacing any wafer to execute the read operation.

Each of the reader units can read wafers housed in a cassette, a standard wafer holding device. It is important to note that the principles of the inventions apply to reading wafer scribes regardless of the device used to hold the wafers or to support the wafers during a read operation. The mirror assembly described in detail above can be used to read wafers contained in a variety of wafer housing devices, regardless of the specific structure of the holding device.

The implementations above highlight a number of variations in the specific implementation of the drive assembly, the structure and orientation of the camera assembly, and the structure and orientation of various types of light sources. It is important to note that the design of each of these elements can vary without departing from the scope of the invention.

In view of the many possible embodiments to which the principles of my invention may be applied, it should be recognized that the implementations described above are only examples of the invention and should not be taken as a limitation on the scope of the invention. Rather, the scope of the invention is defined by the following claims. I therefore claim as my invention all that comes within the scope and spirit of these claims.

I claim:

1. A mirror assembly for reading wafer scribes on a plurality of wafers, the mirror assembly comprising:
    a mirror mount;
    a plurality of mirrors coupled to the mirror mount, the plurality of mirrors forming slots between pairs of adjacent mirrors, where each slot is positioned to receive a wafer such that a mirror in each slot is located next to a corresponding wafer, is stationary relative to the other mirrors, and is angled to direct coaxial light to and to reflect light from a wafer surface of the corresponding wafer into a sight path of a camera;
    wherein the mirror assembly enables reading a scribe on each of the wafers without displacing the wafers to read the scribes, and the mirror assembly is used in conjunction with a beam splitter that is positioned to allow light from a light source to be coaxial with the light reflected from the wafer surface and directed into the camera.

2. The mirror assembly of claim 1 wherein the plurality of mirrors are positioned to be inserted between the series of wafers and to reflect lighting depicting a wafer scribe on each of the wafers without moving the mirror assembly relative to the wafers.

3. The mirror assembly of claim 1 wherein normal vectors of each of the mirrors are substantially parallel.

4. The mirror assembly of claim 1 further including a wafer locating nest.

5. The mirror assembly of claim 4 further including a cassette guide for aligning a cassette holding the wafers with the plurality of mirrors.

6. The mirror assembly of claim 4 wherein the locating nest comprises a series of grooves for supporting the wafers in a cassette when the slots are positioned to receive the wafers in the cassette, and for aligning the wafers relative to the mirrors.

7. A wafer reader for reading wafer scribes on a plurality of wafers comprising:

a camera assembly;

a mirror assembly including:

a mirror mount;

a plurality of mirrors coupled to the mirror mount, the plurality of mirrors positioned to be inserted between a series of spaced apart wafers without displacing the wafers relative to each other and angled to reflect light from the wafer surfaces, including a wafer scribe, into a corresponding line of sight for each wafer;

a light source for directing light to the mirrors in the mirror assembly;

a beam splitter for allowing light originating from behind the beam splitter to pass through and continue toward a mirror in the mirror assembly, and for reflecting the light reflected from the wafer surfaces to the camera such that the light from the light source and the light reflected from the wafer surfaces to the camera is coaxial; and a drive device for moving either the camera assembly or the mirror assembly relative to the other such that the camera assembly reads the wafer scribe from each wafer when located at a position or positions intersecting with the corresponding line of sight for a mirror associated with each wafer.

8. The reader of claim 7 wherein normal vectors of each of the mirrors are substantially parallel.

9. The reader of claim 7 further including a wafer locating nest.

10. The reader of claim 9 wherein the locating nest comprises a series of grooves for supporting the wafers in a cassette when the mirrors are inserted between the wafers in a cassette, and for aligning the wafers relative to the mirrors.

11. The reader of claim 7 further including a cassette guide coupled to the mirror mount for aligning a cassette housing the wafers with the plurality of mirrors.

12. The reader of claim 7 wherein the drive device is a stepper drive for moving the camera relative to the mirror mount, which is stationary.

13. The reader of claim 12 including sensors for detecting the position of the camera assembly.

14. The reader of claim 7 wherein the drive device is a stepper driver for moving the mirror assembly and a wafer holding device holding the cassettes relative to a stationary camera in the camera assembly.

15. The reader of claim 14 including sensors for detecting the position of the mirror assembly and wafer holding device.

16. The reader of claim 7 including a bright field light source for directing coaxial light to the mirrors in the mirror assembly.

17. The reader of claim 7 including a dark field light source for directing non-coaxial light to the mirrors in the mirror assembly.

18. The reader of claim 17 wherein the camera assembly includes a camera mirror for reflecting the light reflected from the wafer surfaces to the camera.

19. The reader of claim 1 including a shelf mount for supporting a cassette housing the wafers.

20. A method for reading scribes from surfaces of wafers comprising:

positioning a mirror assembly, comprising a mirror mount and mirrors attached to the mirror mount, such that each mirror protrudes between adjacent wafers housed in a wafer holding device and each mirror is stationary relative to the other mirrors in the assembly;

directing lighting from a light source onto the surface of a wafer;

using each of the mirrors to reflect light from the surface of the corresponding wafer in the wafer holding device to a corresponding line of sight for the wafer, where the light reflected from the surface of the corresponding wafer depicts a wafer scribe from a surface of the corresponding wafer;

with a beam splitter, making the light reflected from the surface of a wafer coaxial with light directed onto the surface of the wafer from the light source; and reading the wafer scribe from the surface of each wafer using a camera with a field of view that intersects the corresponding line of sight of at least one wafer per read operation.

21. The method of claim 20 wherein the wafer holding device is a cassette and the step of positioning the mirror assembly comprises:

positioning the cassette onto a wafer locating nest attached to the mirror assembly such that the wafer locating nest aligns the wafers in between the mirrors.

22. The method of claim 20 wherein the wafer holding device is a cassette and the step of positioning the mirror assembly comprises:

positioning the cassette on a shelf mount and moving the cassette toward the mirror assembly such that the mirrors protrude between adjacent wafers in the cassette.

23. The method of claim 20 wherein the step of directing lighting comprises directing bright field lighting by directing coaxial light to the mirrors and reflecting the coaxial light normal to the wafer surfaces with the mirrors such that the mirrors remain stationary relative to the wafers.

24. The method of claim 20 wherein the step of directing lighting comprises directing dark field lighting by directing non-coaxial light to the mirrors and reflecting the non-coaxial light to the wafer surfaces with the mirrors such that the reflected, non-coaxial light is not normal to the surfaces of the wafers and the mirrors remain stationary relative to the wafers.

25. The method of claim 20 wherein the step of reading comprises:

using a single moving camera to read each wafer scribe by moving the camera so that the field of view of the camera intersects the line of sight of each wafer in a predetermined sequence.

26. The method of claim 20 wherein the step of reading comprises:

using a single camera and moving the wafers relative to the camera so that the field of view of the camera intersects the line of sight of each wafer in a predetermined sequence.

* * * * *

UNITED STATES PATENT AND TRADEMARK OFFICE
CERTIFICATE OF CORRECTION

PATENT NO.   : 5,933,521
DATED        : August 3, 1999
INVENTOR(S)  : Robert A. Pasic It is certified that error appears in the above-identified patent and that said Letters Patent is hereby corrected as shown below:

Title page,
ABSTRACT, line 9, reads "cassette the moves", should read -- cassette that moves --

Column 2,
Line 17, reads "cameras", should read -- camera's --
Line 29, reads "wafers", should read -- wafer's --

Column 10,
Line 39, reads "water", should read --wafer --

Column 14,
Line 1, reads "claim 1 including", should read -- claim 17 including --

Signed and Sealed this

Twelfth Day of March, 2002

Attest:

Attesting Officer

JAMES E. ROGAN
Director of the United States Patent and Trademark Office